US010395808B2

(12) United States Patent
Li et al.

(10) Patent No.: US 10,395,808 B2
(45) Date of Patent: Aug. 27, 2019

(54) DECOUPLING INDUCTOR ASSEMBLY, RADIO FREQUENCY RECEIVING COIL AND MAGNETIC RESONANCE IMAGING APPARATUS

(71) Applicants: Wen Ming Li, Shenzhen (CN); Tong Tong, Shenzhen (CN); JianMin Wang, Shenzhen (CN)

(72) Inventors: Wen Ming Li, Shenzhen (CN); Tong Tong, Shenzhen (CN); JianMin Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 907 days.

(21) Appl. No.: 14/813,363

(22) Filed: Jul. 30, 2015

(65) Prior Publication Data

US 2016/0033595 A1    Feb. 4, 2016

(30) Foreign Application Priority Data

Jul. 31, 2014 (CN) .................... 2014 2 0429208 U

(51) Int. Cl.
    *H01F 7/20* (2006.01)
    *G01R 33/36* (2006.01)
    *H01F 5/00* (2006.01)

(52) U.S. Cl.
    CPC ........... *H01F 7/20* (2013.01); *G01R 33/3657* (2013.01); *H01F 5/003* (2013.01); *H01F 7/202* (2013.01)

(58) Field of Classification Search
CPC . H01F 7/20; H01F 7/202; H01F 5/003; G01R 33/3657
See application file for complete search history.

(56) References Cited

U.S. PATENT DOCUMENTS

| | | | | |
|---|---|---|---|---|
| 4,881,034 A | * | 11/1989 | Kaufman | G01R 33/3415 324/318 |
| 5,258,717 A | * | 11/1993 | Misic | G01R 33/3415 324/318 |
| 5,521,506 A | * | 5/1996 | Misic | G01R 33/365 324/318 |
| 7,012,430 B2 | * | 3/2006 | Misic | G01R 33/3415 324/318 |
| 9,977,100 B2 | * | 5/2018 | Crozier | A61B 5/055 |
| 2019/0006085 A1 | * | 1/2019 | Wang | H01F 27/2804 |

FOREIGN PATENT DOCUMENTS

CN      102288930 A     12/2011

* cited by examiner

*Primary Examiner* — Dixomara Vargas
(74) *Attorney, Agent, or Firm* — Lempia Summerfield Katz LLC

(57) ABSTRACT

A decoupling inductor assembly, an RF receiving coil, and an MRI apparatus are provided. The decoupling inductor assembly includes a first inductor and a second inductor. The first inductor includes a first solenoid and a first port pair located at two ends of the first solenoid, and the second inductor includes a second solenoid and a second port pair located at two ends of the second solenoid. The first solenoid and the second solenoid are wound partially or completely overlapped. The first port pair includes at least one pair of first parallel connection interfaces, and the second port pair includes at least one pair of second parallel connection interfaces.

18 Claims, 5 Drawing Sheets

DECOUPLING INDUCTOR ASSEMBLY, RADIO FREQUENCY RECEIVING COIL AND MAGNETIC RESONANCE IMAGING APPARATUS

CROSS-REFERENCE TO RELATED APPLICATIONS

The present patent document claims the benefit of CN 201420429208.0, filed on Jul. 31, 2014, which is hereby incorporated by reference in its entirety.

TECHNICAL FIELD

The present embodiments relate to the technical field of magnetic resonance imaging.

BACKGROUND

Magnetic resonance imaging (MRI) is a technology where the phenomenon of magnetic resonance is utilized for the purpose of imaging. The main principles of magnetic resonance are as follows. When an atomic nucleus contains a single proton, as is the case, for example, with the nuclei of the hydrogen atoms that are present throughout the human body, this proton exhibits spin motion and resembles a small magnet. The spin axes of these small magnets lack a definite pattern, and if an external magnetic field is applied, the small magnets will be rearranged according to the magnetic force lines of the external field (e.g., the small magnets will line up in two directions), either parallel or anti-parallel (perpendicular) to the magnetic force lines of the external magnetic field. The direction parallel to the magnetic force lines of the external magnetic field is the positive longitudinal axis, while the direction anti-parallel (e.g., perpendicular) to the magnetic force lines of the external magnetic field is the negative longitudinal axis. The atomic nuclei only have a longitudinal magnetization component that has both a direction and a magnitude. A radio frequency (RF) pulse of a specific frequency is used to excite the atomic nuclei in the external magnetic field such that spin axes of the atomic nuclei deviate from the positive longitudinal axis or negative longitudinal axis, giving rise to resonance, the phenomenon of magnetic resonance. Once the spin axes of the excited atomic nuclei have deviated from the positive or negative longitudinal axis, the atomic nuclei have a transverse magnetization component.

Once emission of the RF pulse has ended, the excited atomic nucleus emits an echo signal, gradually releasing the absorbed energy in the form of electromagnetic waves, such that phase and energy level both return to the pre-excitation state. An image may be reconstructed by subjecting the echo signal emitted by atomic nuclei to further processing (e.g., spatial encoding).

RF phased array coils are a type of RF receiving coil that are commonly used in MRI systems. RF phased array coils include multiple coil units (e.g., surface coil units). Inductive coupling will exist between any two coil units (e.g., surface coil units) that are close to each other, and inductive coupling will give rise to noise. In order to reduce noise and increase the reception signal-to-noise ratio (SNR) of the RF receiving coils, the inductive coupling between surface coil units is to be reduced (e.g., decouple the surface coil units).

In the prior art, common decoupling methods may include inductive decoupling, capacitive decoupling, decoupling by superposition, and low-noise preamplifer decoupling. Inductive decoupling is achieved by connecting inductively coupled coil units to a decoupling inductor assembly separately to eliminate the inductive coupling. Decoupling inductor assemblies in the prior art may include two solenoids formed by two helically wound inductive coils. The winding may consist of interwoven helixes (e.g., the inductive coils of the two solenoids are interwoven and overlapped) or adjacent helixes (e.g., the entire inductive coils of the two solenoids are positioned one above the other), with the internal areas of the two solenoids being fully or partially overlapped. When inductive decoupling is employed, the coupling inductance is to be varied by adjusting the cross-sectional area, number of turns, and winding density of the inductive coils.

For example, Chinese Patent Application Publication Number CN 102288930 A describes a magnetic resonance RF receiving coil and an inductive decoupling device thereof in the prior art.

SUMMARY AND DESCRIPTION

The scope of the present invention is defined solely by the appended claims and is not affected to any degree by the statements within this summary.

The present embodiments may obviate one or more of the drawbacks or limitations in the prior art. For example, a decoupling inductor assembly including a first inductor and a second inductor is provided. The first inductor includes a first solenoid and a first port pair located at two ends of the first solenoid, and the second inductor includes a second solenoid and a second port pair located at two ends of the second solenoid. The first solenoid and the second solenoid are wound in such a way as to be partially or completely overlapped. The first port pair includes at least one pair of first parallel connection interfaces, and the second port pair includes at least one pair of second parallel connection interfaces.

In an embodiment, a capacitor is included, connected in parallel between the first parallel connection interfaces or between the second parallel connection interfaces.

In an embodiment, an inductor is included, connected in parallel between the first parallel connection interfaces or between the second parallel connection interfaces.

In an embodiment, an RF component is included, connected in parallel between the first parallel connection interfaces or between the second parallel connection interfaces.

In an embodiment, the RF component is a microstrip line.

In an embodiment, an inductor support, on which the first solenoid and the second solenoid are wound, is included.

In one embodiment, an RF receiving coil includes multiple coil units and more than one of any of the decoupling inductor assemblies described above, with two adjacent coil units connected to the first port pair and the second port pair, respectively.

In one embodiment, an MRI apparatus includes the RF receiving coil, as described above.

In an embodiment, the decoupling inductor assembly may achieve the beneficial effect of adjusting (e.g., increasing or decreasing) coupling inductance by a device (e.g., a capacitor or inductor connected in parallel therewith).

DETAILED DESCRIPTION

Figure 3A:
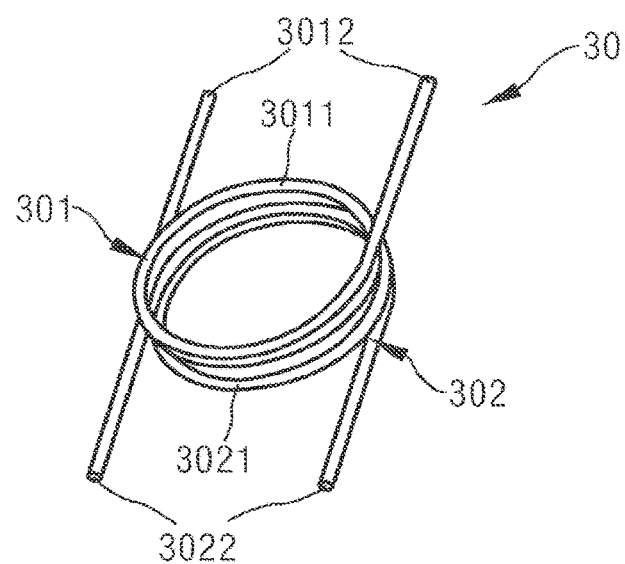
FIG. 3A is a perspective view of a first decoupling inductor assembly according to an embodiment.
Figure 3B:
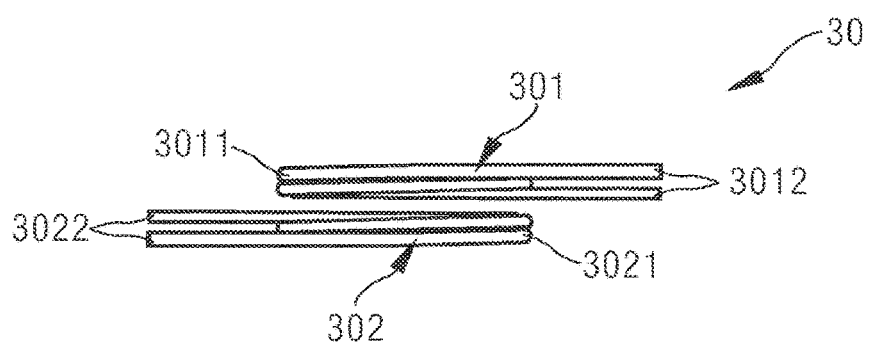
FIG. 3B is a side view of the first decoupling inductor assembly according to an embodiment.
Figure 3C:
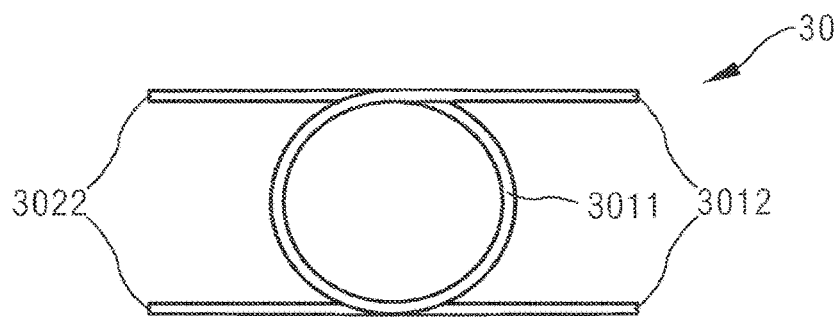
FIG. 3C is a view from above of the first decoupling inductor assembly according to an embodiment

FIG. 3A is a perspective view of a first decoupling inductor assembly according to an embodiment. FIG. 3B is a side view of the first decoupling inductor assembly according to an embodiment. FIG. 3C is a view from above of the first decoupling inductor assembly according to an embodiment. As depicted in FIGS. 3A, 3B and 3C, the first decoupling inductor assembly 30 according to an embodiment includes a first inductor 301 and a second inductor 302. The first inductor 301 includes a first solenoid 3011 and a first port pair 3012 located at the two ends of the first solenoid. The second inductor 302 includes a second solenoid 3021 and a second port pair 3022 located at two ends of the second solenoid. The first solenoid 3011 and second solenoid 3021 are wound coaxially and adjacent to each other. For example, the first inductor 301 and second inductor 302 include the first solenoid 3011 and the second solenoid 3021, respectively, and are wound from metal wire, are coaxial, and have the same winding direction and cross-sectional area.

In an embodiment of the RF receiving coil, the cross-sectional area, the number of turns and the winding density of the first inductor and second inductor, respectively, connected to inductively coupled coil units may be adjusted to vary the size of the inductance of inductive coupling of the coil units.

Figure 3D:
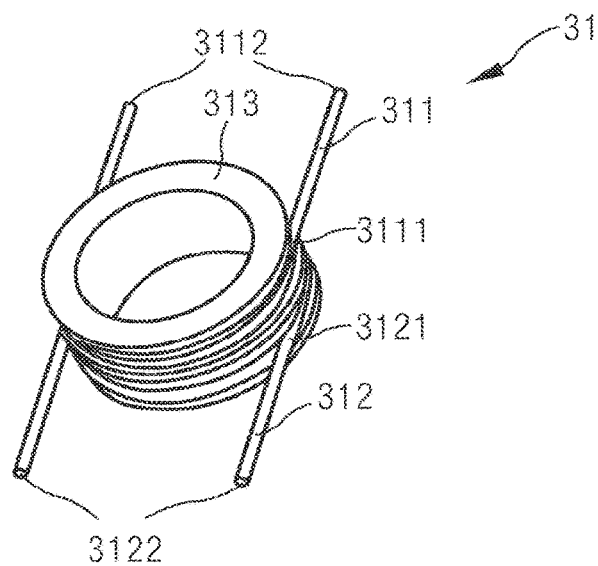
FIG. 3D is a perspective view of a second decoupling inductor assembly according to an embodiment.

FIG. 3D is a perspective view of a second decoupling inductor assembly according to an embodiment. As FIG. 3D depicts, the second decoupling inductor assembly 31 according to an embodiment includes a first inductor 311, a second inductor 312 and an inductor support 313. The first inductor 311 includes a first solenoid 3111 and a first port pair 3112 located at two ends of the first solenoid. The second inductor 312 includes a second solenoid 3121 and a second port pair 3122 located at the two ends of the second solenoid. The first solenoid 3111 and second solenoid 3121 are coaxially wound on the inductor support 313. The second decoupling inductor assembly according to an embodiment may solve the problem of precision to a certain extent. When the diameter and number of turns of the inductor are to be changed, the inductor support may also need to be redesigned and purchased. In the case of decoupling inductors that have already been manufactured, it may be difficult to adjust the inductance value by adjusting the solenoid density.

Figure 3E:
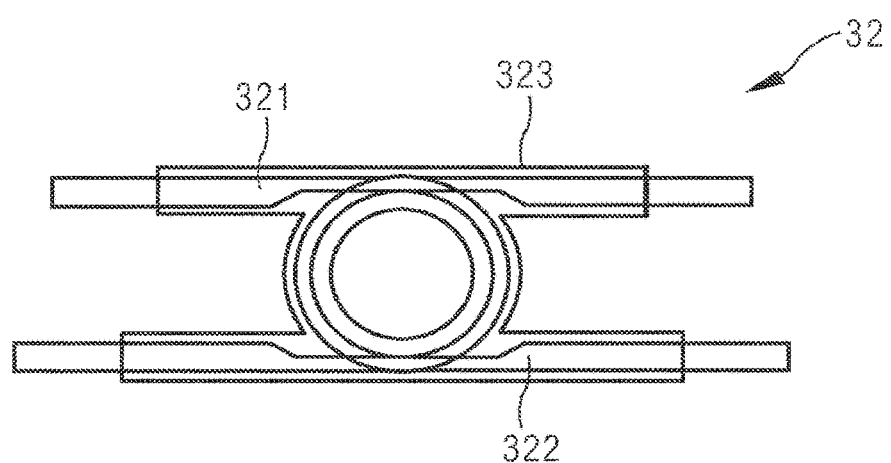
FIG. 3E is a schematic diagram of a third decoupling inductor assembly according to an embodiment.

FIG. 3E is a perspective view of a third decoupling inductor assembly according to an embodiment. As FIG. 3E depicts, the third decoupling inductor assembly 32 of an embodiment includes a first inductor 321, a second inductor 322, and an inductor support 323. The inductor support 323 includes a multi-layer printed circuit board, with the first inductor 321 and second inductor 322 being solenoids printed on the multi-layer printed circuit board. The solenoid density of the third decoupling inductor assembly 32 in an embodiment is determined by the thickness of the printed circuit board. For example, when the diameter, number of turns, and density of the solenoid are changed, the printed circuit board may be redesigned.

A decoupling inductor assembly is provided in an embodiment, including a first inductor and a second inductor. The first inductor includes a first solenoid and a first port pair located at two ends of the first solenoid. The second inductor includes a second solenoid and a second port pair located at two ends of the second solenoid. The first solenoid and the second solenoid are wound in such a way as to be partially or completely overlapped. The first port pair includes at least one pair of first parallel connection interfaces, and the second port pair includes at least one pair of second parallel connection interfaces.

Figure 1A:
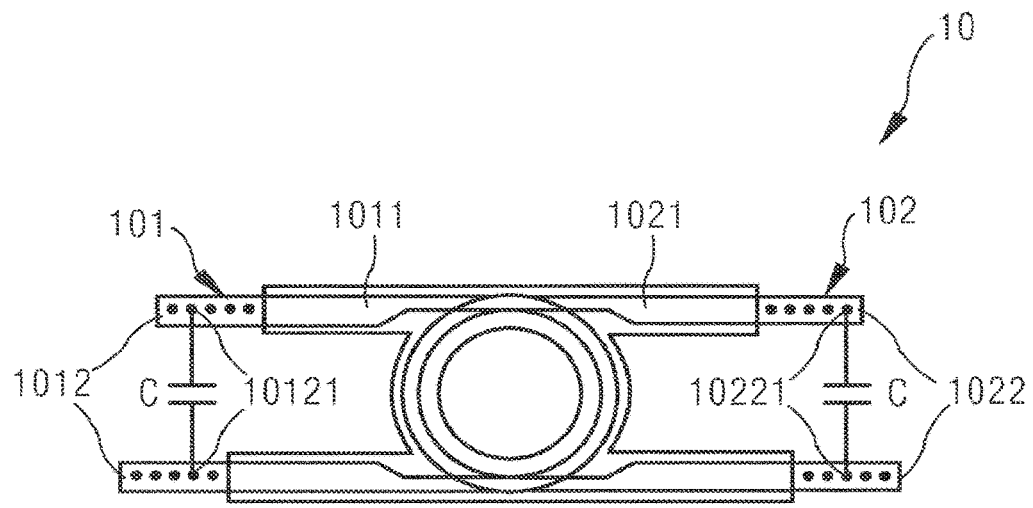
FIG. 1A is a first view from above of a decoupling inductor assembly according to an embodiment.
Figure 1B:
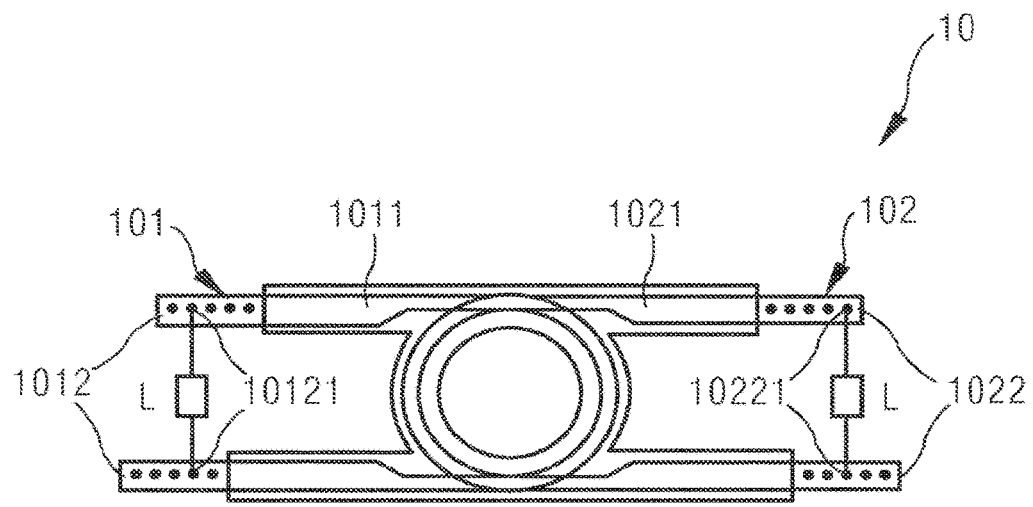
FIG. 1B is a second view from above of a decoupling inductor assembly according to an embodiment.

FIG. 1A is a first view from above of a decoupling inductor assembly according to an embodiment. FIG. 1B is a second view from above of a decoupling inductor assembly according to an embodiment. As depicted in FIGS. 1A and 1B, a decoupling inductor assembly 10 includes a first inductor 101 and a second inductor 102. The first inductor 101 includes a first solenoid 1011 and a first port pair 1012 located at the two ends of the first solenoid. The second inductor 102 includes a second solenoid 1021 and a second port pair 1022 located at the two ends of the second solenoid. The first solenoid 1011 and second solenoid 1021 are wound adjacent to each other or interwoven in such a way as to be partially or completely overlapped. The first port pair 1012 includes at least one pair of first parallel connection interfaces 10121, and the second port pair 1022 includes at least one pair of second parallel connection interfaces 10221.

As depicted in 1A, in the decoupling inductor assembly 10 according to an embodiment, the size of the coupling inductance is adjusted by connecting a capacitor C to the first parallel connection interfaces 10121 and/or second parallel connection interfaces 10221 (e.g., connecting a capacitor in parallel at one end or two ends of the decoupling inductor assembly 10).

For example, a capacitor C is connected in parallel at the first parallel connection interfaces 10121 of the first port pair 1012 of the first inductor 101 of the decoupling inductor assembly 10. This example is equivalent to increasing the inductance of the first inductor 101, and therefore increasing the magnetic flux of the decoupling inductor assembly 10 (e.g., increasing the coupling inductance). The larger the capacitor C, the larger the coupling inductance. Thus, the decoupling inductor assembly according to this embodiment may achieve the beneficial effect of adjusting (e.g., increasing) the coupling inductance.

As depicted in FIG. 1, in the decoupling inductor assembly 10 according to an embodiment, the size of the coupling inductance is adjusted by connecting an inductor I to the first parallel connection interfaces 10121 and/or second parallel connection interfaces 10221 (e.g., connecting an inductor in parallel at one end or two ends of the decoupling inductor assembly 10).

For example, an inductor I is connected in parallel at the first parallel connection interfaces 10121 of the first port pair 1012 of the first inductor 101 of the decoupling inductor assembly 10. This example is equivalent to reducing the inductance of the first inductor 101, and therefore reducing the magnetic flux of the decoupling inductor assembly 10 (e.g., reducing the coupling inductance). The larger the inductor I, the smaller the coupling inductance. Thus, the decoupling inductor assembly according to this embodiment may achieve the beneficial effect of adjusting (e.g., reducing) the coupling inductance.

The two decoupling inductor assemblies above are not limited to inductors and capacitors connected in parallel. Additional, fewer or different RF components may be used (e.g., a microstrip line may also be connected in parallel).

Figure 2A:
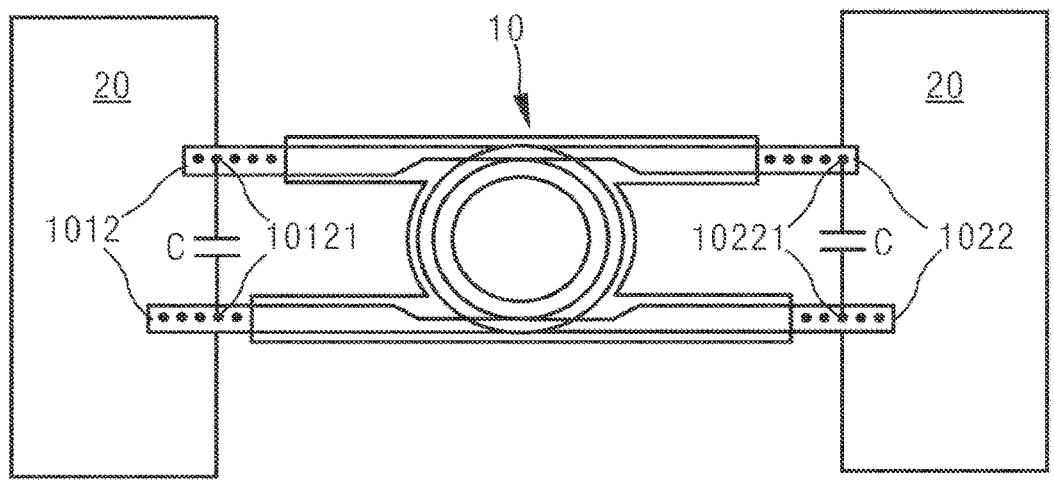
FIG. 2A is a first view from above of an RF receiving coil according to an embodiment.
Figure 2B:
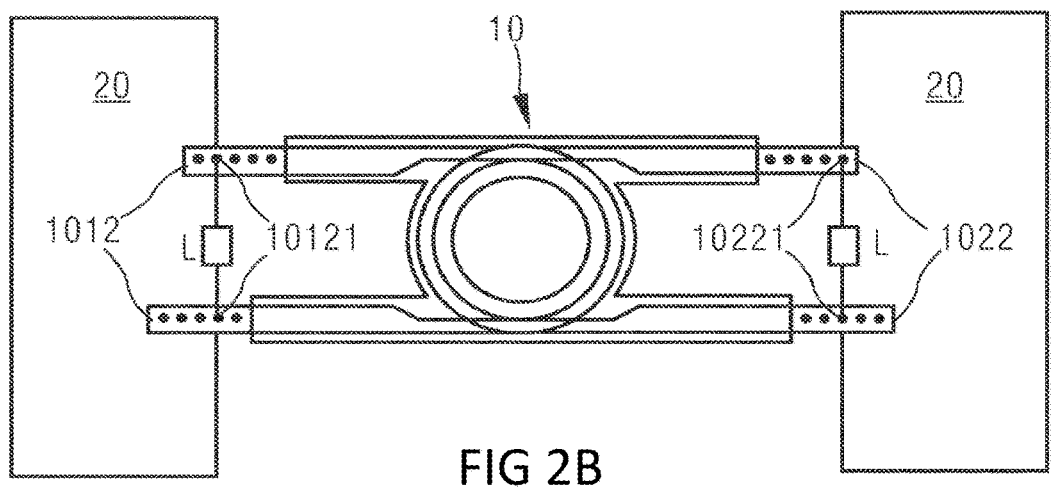
FIG. 2B is a second view from above of an RF receiving coil according to an embodiment.

FIG. 2A is a first view from above of an RF receiving coil according to an embodiment. FIG. 2B is a second view from above of an RF receiving coil according to an embodiment. As depicted in FIGS. 2A and 2B, in an embodiment, an RF receiving coil is also provided. The RF receiving coil includes multiple coil units 20 and multiple decoupling inductor assemblies 10, with two adjacent coil units 20 connected to the first port pair 1012 and the second port pair 1022, respectively.

As depicted in FIG. 2A, in the RF receiving coil according to an embodiment, two adjacent coil units 20 are connected to a decoupling inductor assembly 10 by the first port pair 1012 and the second port pair 1022. The size of the coupling inductance is adjusted by connecting a capacitor C to the first parallel connection interfaces 10121 and/or second parallel connection interfaces 10221 (e.g., connecting a capacitor in parallel at one end or two ends of the decoupling inductor assembly 10).

As depicted in FIG. 2B, in the RF receiving coil according to an embodiment, two adjacent coil units 20 are connected to a decoupling inductor assembly 10 by the first port pair 1012 and the second port pair 1022. The size of the coupling inductance is adjusted by connecting an inductor I to the first parallel connection interfaces 10121 and/or second parallel connection interfaces 10221 (e.g., connecting an inductor in parallel at one end or two ends of the decoupling inductor assembly 10).

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A decoupling inductor assembly connectable to two adjacent coil units, the decoupling inductor assembly comprising:
a first inductor comprising a first solenoid and a first port pair located at two ends of the first solenoid; and
a second inductor comprising a second solenoid and a second port pair located at two ends of the second solenoid,
wherein the first solenoid and the second solenoid are wound partially or completely overlapped, and
wherein the first port pair comprises at least one pair of first parallel connection interfaces, and the second port pair comprises at least one pair of second parallel connection interfaces.

2. The decoupling inductor assembly of claim 1, further comprising a capacitor connected in parallel between the first parallel connection interfaces or connected between the second parallel connection interfaces.

3. The decoupling inductor assembly of claim 1, further comprising an inductor connected in parallel between the at least one pair of first parallel connection interfaces or connected between the at least one pair of second parallel connection interfaces.

4. The decoupling inductor assembly of claim 1, further comprising a radio frequency (RF) component connected in parallel between the at least one pair of first parallel connection interfaces or between the at least one pair of second parallel connection interfaces.

5. The decoupling inductor assembly of claim 4, wherein the RF component is a microstrip line.

6. The decoupling inductor assembly of claim 1, further comprising an inductor support on which the first solenoid and the second solenoid are wound.

7. A radio frequency (RF) receiving coil comprising:
a plurality of coil units; and
a plurality of decoupling inductor assemblies, each decoupling inductor assembly of the plurality of decoupling inductor assemblies comprising:
a first inductor comprising a first solenoid and a first port pair located at two ends of the first solenoid; and
a second inductor comprising a second solenoid and a second port pair located at two ends of the second solenoid,
wherein the first solenoid and the second solenoid are wound partially or completely overlapped,
wherein the first port pair comprises at least one pair of first parallel connection interfaces, and the second port pair comprises at least one pair of second parallel connection interfaces, and
wherein two of the plurality of adjacent coil units are connected to the first port pair and the second port pair, respectively.

8. The RF receiving coil of claim 7, wherein at least one decoupling inductor assembly of the plurality of decoupling inductor assemblies comprises a capacitor connected in parallel between the at least one pair of first parallel connection interfaces or connected between the at least one pair of second parallel connection interfaces.

9. The RF receiving coil of claim 7, wherein at least one decoupling inductor assembly of the plurality of decoupling inductor assemblies comprises an inductor connected in parallel between the at least one pair of first parallel connection interfaces or connected between the at least one pair of second parallel connection interfaces.

10. The RF receiving coil of claim 7, wherein at least one decoupling inductor assembly of the plurality of decoupling inductor assemblies comprises an RF component, connected in parallel between the at least one pair of first parallel connection interfaces or between the at least one pair of second parallel connection interfaces.

11. The RF receiving coil of claim 10, wherein the RF component is a microstrip line.

12. The RF receiving coil of claim 7, wherein at least one decoupling inductor assembly of the plurality of decoupling inductor assemblies comprises an inductor support on which the first solenoid and the second solenoid are wound.

13. A magnetic resonance imaging apparatus comprising:
a radio frequency (RF) receiving coil comprising:
a plurality of coil units; and a plurality of decoupling inductor assemblies, each decoupling inductor assembly of the plurality of decoupling inductor assemblies comprising:
  a first inductor comprising a first solenoid and a first port pair located at two ends of the first solenoid; and
  a second inductor comprising a second solenoid and a second port pair located at two ends of the second solenoid,
wherein the first solenoid and the second solenoid are wound partially or completely overlapped,
wherein the first port pair comprises at least one pair of first parallel connection interfaces, and the second port pair comprises at least one pair of second parallel connection interfaces, and
wherein two of the plurality of adjacent coil units are connected to the first port pair and the second port pair, respectively.

14. The magnetic resonance imaging apparatus of claim 13, wherein the decoupling inductor assembly comprises a capacitor connected in parallel between the at least one pair of first parallel connection interfaces or connected between the at least one pair of second parallel connection interfaces.

15. The magnetic resonance imaging apparatus of claim 13, wherein the decoupling inductor assembly comprises an inductor connected in parallel between the at least one pair of first parallel connection interfaces or connected between the at least one pair of second parallel connection interfaces.

16. The magnetic resonance imaging apparatus of claim 13, wherein the decoupling inductor assembly comprises an RF component, connected in parallel between the at least one pair of first parallel connection interfaces or between the at least one pair of second parallel connection interfaces.

17. The magnetic resonance imaging apparatus of claim 16, wherein the RF component is a microstrip line.

18. The magnetic resonance imaging apparatus of claim 13, wherein the decoupling inductor assembly comprises an inductor support on which the first solenoid and the second solenoid are wound.

\* \* \* \* \*